United States Patent
Tsukada et al.

[19]

[11] Patent Number: 5,962,955
[45] Date of Patent: Oct. 5, 1999

[54] PIEZOELECTRIC DEVICE AND METHOD FOR FABRICATING THE SAME, AND INK JET PRINTER HEAD AND METHOD FOR FABRICATING THE SAME

[75] Inventors: Mineharu Tsukada; Koji Omote; Masaharu Hida; Nobuo Kamehara; Motoyuki Nishizawa; Kazuaki Kurihara, all of Kawasaki, Japan

[73] Assignee: Fujitsu Limited, Kawasaki, Japan

[21] Appl. No.: 08/796,682

[22] Filed: Feb. 7, 1997

[30] Foreign Application Priority Data

Mar. 19, 1996 [JP] Japan .................................... 8-062501

[51] Int. Cl.$^6$ ....................... H01L 41/083; H01L 41/047; B41J 2/045
[52] U.S. Cl. .......................... 310/366; 310/328; 310/366
[58] Field of Search ................................... 310/328, 366, 310/371

[56] References Cited

U.S. PATENT DOCUMENTS

| | | | |
|---|---|---|---|
| 4,752,788 | 6/1988 | Yasuhara et al. | 310/328 |
| 5,215,446 | 6/1993 | Takahashi et al. | 417/322 |
| 5,459,501 | 10/1995 | Lee et al. | 347/68 |
| 5,473,214 | 12/1995 | Hildebrand | 310/328 |
| 5,665,249 | 9/1997 | Burke et al. | 316/2 |
| 5,691,752 | 11/1997 | Moynihan et al. | 310/328 |
| 5,736,994 | 4/1998 | Takahashi | 347/11 |

FOREIGN PATENT DOCUMENTS

| | | | |
|---|---|---|---|
| 5318735 | 12/1993 | Japan | B41J 2/045 |
| 6-112550 | 4/1994 | Japan | H01L 41/24 |
| 060188474 | 7/1994 | Japan | 310/328 |
| 6-188472 | 7/1994 | Japan | 310/328 |
| 6-198895 | 7/1994 | Japan | B41J 2/16 |
| WO 92/09111 | 5/1992 | WIPO | 310/366 |

OTHER PUBLICATIONS

Mills, et al., A piezoceramic fine-movement control, The Institute of Physics, pp.295–296, 1981.

*Primary Examiner*—Thomas M. Dougherty
*Attorney, Agent, or Firm*—Armstrong, Westerman, Hattori, McLeland & Naughton

[57] ABSTRACT

A piezoelectric device including an insulating substrate and a displacement layer formed on the insulating substrate including a first common electrode, a piezoelectric layer and a plurality of second electrodes laid on the insulating substrate in the stated order, where a part of a surface of the piezoelectric device in a region where the first and the second electrodes overlap each other is projected out of the rest part of the surface. The thus-formed piezoelectric device can increase the amount of displacement of the displacement layer.

4 Claims, 10 Drawing Sheets

PIEZOELECTRIC DEVICE AND METHOD FOR FABRICATING THE SAME, AND INK JET PRINTER HEAD AND METHOD FOR FABRICATING THE SAME

BACKGROUND OF THE INVENTION

The present invention relates to a piezoelectric device, more specifically a piezoelectric device for use in ink jet printers and a method for fabricating the same, an ink jet printer head and a method for fabricating the same.

Ink jet printers are printers of the type that liquid ink is formed in droplets or in a liquid column, or atomized to jet into the air to print letters, graphs, pictures, etc. on recording paper. Ink jet printers can be quieter, lighter and smaller, which has put ink jet printers into practical use.

Heads for use in ink jet printers predominantly use two types of the head. One, where bubbles are generated by heaters in the pressure chambers to jet the ink out of the nozzles by the force of the bubbles (bubble jet type), and a second that uses vibration plates, provided on the bottoms of the pressure chambers, to press the piezoelectric bodies causing the ink to jet out of the nozzles (impact type).

Of these two types, the capability of the bubble jet type depends substantially upon the characteristics of the ink, and has its limitations with regard to its printing speed and print quality. This type has found it difficult to keep up with trends in higher speed and higher print quality.

Conversely, the impact type is capable of using inks with a wide range of characteristics, and is suitable for higher print speeds and has good controllability.

Figure 10:
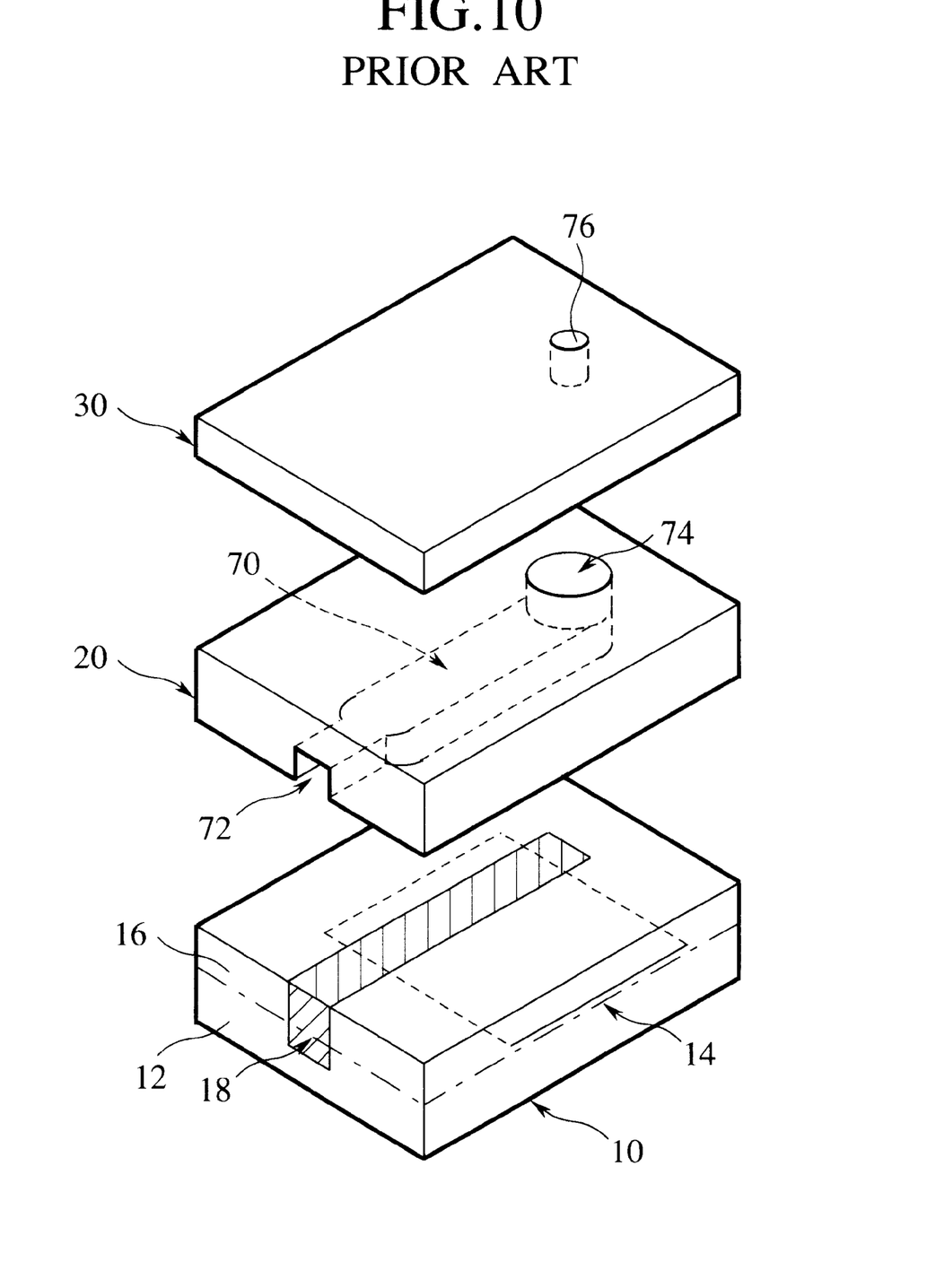
FIG. 10 is a diagrammatic view of the conventional ink jet printer head.

The head of the impact type has a structure exemplified in FIG. 10.

The ink jet printer head shown in FIG. 10 comprises a piezoelectric device 10, a pressure chamber plate 20 and a nozzle plate 30. The piezoelectric device 10 includes a lower electrode 14 having a relatively large area, a piezoelectric layer 16 of a piezoelectric material, and an upper electrode 18 laid on the insulating substrate 12 of ceramics or others in the stated order. In the pressure chamber plate 20 there is formed a pressure chamber 70, opened in one side of the pressure chamber plate 20, an ink feed passage 72, through which ink is fed into the pressure chamber 70 and an ink conduit 74 which leads the ink from the pressure chamber 70 through to the other side of the pressure chamber plate 20. In the nozzle plate 30, there is formed a nozzle 76 which ejects the ink.

The piezoelectric device 10 and the pressure chamber plate 20 are joined with the pressure chamber 70 in alignment with a region of the piezoelectric device 10 where the upper electrode 18 is formed, so that the ink can be charged into the pressure chamber 70. The nozzle plate 30 is connected to the pressure chamber plate 20, and the ink led through the ink conduit 72 in the pressure chamber plate 20 can jet from the nozzle 76 of the nozzle plate 30.

In this structure, a prescribed voltage is applied between the lower electrode 14 and the upper electrode 18, causing the piezoelectric layer 16, in the region where the upper and the lower electrodes are laid on top of each other, to be displaced, and a pressure is applied to the ink in the pressure chamber 70. This pressure jets the ink through the nozzle 76.

The ink jet printer head of the impact type has the above-described structure.

In the fabrication process of the above-described conventional ink jet printer head, the piezoelectric device is constructed by forming the piezoelectric layer separately and then adhering the separately formed piezoelectric layer to the insulation substrate or to the lower electrode by means of an adhesive or other means, or by screen-stenciling a piezoelectric material thereon.

Otherwise, the lower electrode, the piezoelectric layer and the upper electrode are laid on the insulation substrate, and then the layer body is press-adhered by a uniaxial press to thereby form the piezoelectric device. The uniaxial press is a method by which a sample is held between two flat plates, and the flat plates are pressed on both sides to apply pressure.

In the above-described conventional piezoelectric device fabrication method however, it is necessary to separately form the piezoelectric layer and adhere the piezoelectric layer by an adhesive or others to the insulation substrate. This increases the number of fabrication steps and limits the amount of simultaneous production. Undesirably from the viewpoint of fabrication cost this results in higher fabrication costs.

In consideration of the drive of the piezoelectric device it is preferable that the piezoelectric layer is thin, but it is difficult in the screen-stenciling method to form the piezoelectric layer less than 50 μm in thickness.

The usual piezoelectric device fabrication process uses the uniaxial press method. Because of the convexity in the form of the upper electrode on the surface of the piezoelectric device before the press, higher pressures are exerted upon it than those exerted on the rest of the device. As a result, non-uniform pressures are generated in a sample during the press which causes cracks, and peeling appear in a later sintering step.

Recently from the viewpoint of environmental protection, use of lead (Pb) has been positively suppressed. Piezoelectric materials of the piezoelectric devices contain lead, and it is unpreferable to use much of the piezoelectric materials. Piezoelectric materials also have high specific gravities, and it has been desirable to decrease amounts of the piezoelectric materials used in the piezoelectric devices to lighten the piezoelectric devices.

SUMMARY OF THE INVENTION

An object of the present invention is to provide a piezoelectric device and a method for fabricating the same, and an ink jet printer head and a method for fabricating the same which can be constructed by simple fabrication steps, and which can be driven at low voltages and are small and light.

The above-described object can be achieved by a piezoelectric device comprising: an insulating substrate; and a displacement layer formed on the insulating substrate including a first electrode, a piezoelectric layer and a second electrode laid on the insulating substrate in the stated order, a part of a surface of the piezoelectric device in region where the first and the second electrodes overlap each other being projected out of the rest part of the surface. The thus-formed piezoelectric device can increase the amount of displacement of the displacement layer. The displacement layers are laid in a multiple layered fashion, whereby larger amounts of displacement can be obtained in comparison with the single displacement layer.

The above-described object can be achieved by a method for fabricating a piezoelectric device comprising a insulating substrate and a displacement layer formed on the insulating substrate including a first electrode, a piezoelectric layer and a second electrode laid on the insulating substrate in the stated order, a slurry with piezoelectric powder dispersed in being applied, by spin coating, onto the insulating substrate with the first electrode, and sintered to form the piezoelectric layer. This method for fabricating a piezoelectric device can form much piezoelectric layer of a uniform thickness in a short period of time, whereby production costs of the piezoelectric device can be much reduced in comparison with those of the conventional method in which piezoelectric layers are adhered.

The above-described object can be achieved by a method for fabricating a piezoelectric device comprising a insulating substrate and a displacement layer formed on the insulating substrate including a first electrode, a piezoelectric layer and a second electrode laid on the insulating substrate in the stated order, piezoelectric powder being deposited on the insulating substrate with the first electrode formed on by electrophoretic deposition in a suspension with the piezoelectric powder dispersed in, and sintered to form the piezoelectric layer. The piezoelectric layer can easily be made thin, whereby the piezoelectric device can be operative at low voltages.

The above-described object can be achieved by a method for fabricating a piezoelectric device comprising a insulating substrate and a displacement layer formed on the insulating substrate including a first electrode, a piezoelectric layer and a second electrode laid on the insulating substrate in the stated order, a piezoelectric green sheet formed of piezoelectric powder being laid on the insulating substrate with the first electrode formed on, and sintered to form the piezoelectric layer. The piezoelectric layer uses greatly decreased amounts of piezoelectric materials. Smaller amounts of lead compounds having high specific gravities can be accordingly decreased, which makes the piezoelectric device compact and light.

The above-described object can be achieved by a method for fabricating a piezoelectric device comprising a insulating substrate and a displacement layer formed on the insulating substrate including a first electrode, a piezoelectric layer and a second electrode laid on the insulating substrate in the stated order, first piezoelectric green sheet of piezoelectric powder having the first electrode formed on, and second piezoelectric green sheet of piezoelectric powder having the second electrode formed on being prepared, and the first piezoelectric green sheet and the second piezoelectric green sheet being alternately laid on the insulating substrate one on another, and sintered to form the displacement layer. The displacement layer of the piezoelectric device can have large amounts of displacement.

In the above-described method for fabricating a piezoelectric device, it is preferable that after the piezoelectric green sheet is laid on the insulating substrate, the insulating substrate and the piezoelectric green sheet is integrated by hydrostatic pressure press. The press can be conducted without occurring disuniform pressure, which prevents occurrence of cracks and releases in the following sintering.

The above-described object can be achieved by an ink jet printer head comprising: a piezoelectric device comprising a insulating substrate and a displacement layer formed on the insulating substrate including a first electrode, a piezoelectric layer and a second electrode laid on the insulating substrate in the stated order; a substrate formed on the displacement layer of the piezoelectric device, and having, on the second electrode, an opening which provide pressure chamber; an insulation plate formed on the substrate; and a high rigidity plate provided on a side wall of a multi-layer body of the piezoelectric device, the substrate and the insulation plate for securing the multi-layer body. The ink jet printer head can efficiently compress the pressure chambers.

The above-described object can be achieved by a method for fabricating an ink jet printer head comprising the steps of: adhering a substrate for forming a pressure chamber to a top of a displacement layer of a piezoelectric device including a first electrode, a piezoelectric layer and a second electrode laid on an insulating substrate in the stated order; patterning the substrate to form the pressure chamber opened on the second electrode; and adhering an insulation plate to a top of the substrate with the pressure chamber formed in.

In the above-described method for fabricating an ink jet printer head, it is preferable that the method further comprises the step of: adhering a high rigidity plate to a side wall of a multi-layer body comprising the piezoelectric device, the substrate and the insulation plate. The ink jet printer head can have good efficiency of compressing the pressure chambers.

DETAILED DESCRIPTION OF THE INVENTION

[First Embodiment]

A method for fabricating a piezoelectric device according to a first embodiment of the present invention will be explained with reference to FIGS. 1A–1C.

Figure 1A:
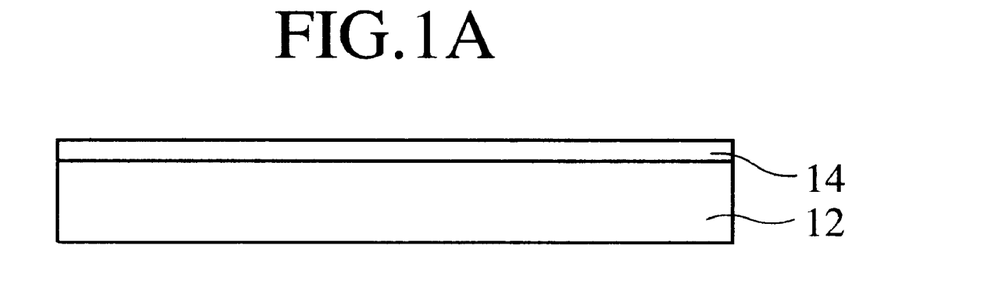
FIGS. 1A–1C are sectional views of the piezoelectric device according to a first embodiment of the present invention at the steps of the method for fabricating the same, which explain the method.
Figure 1B:
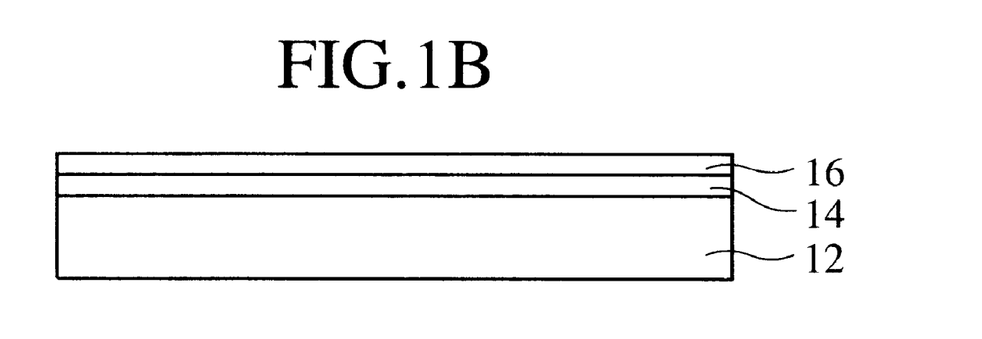
Figure 1C:
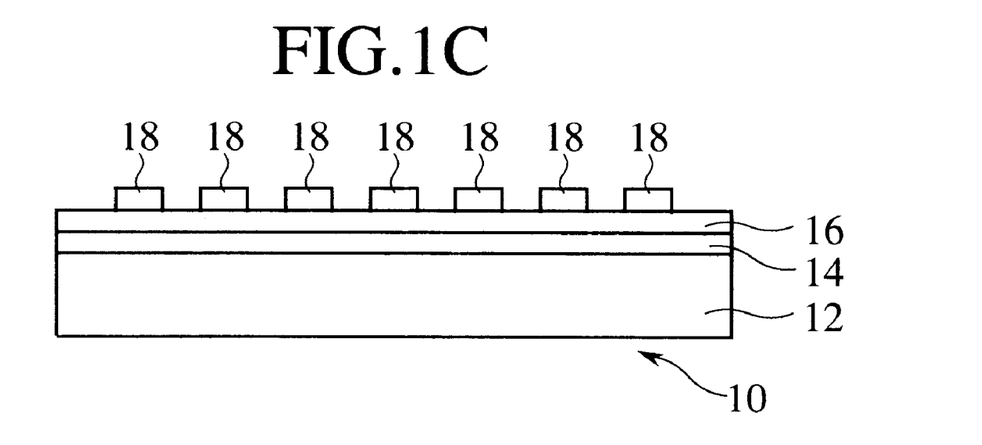

FIGS. 1A–1C are sectional views of the piezoelectric device according to the present embodiment in the steps of the method for fabricating the same.

The method for fabricating the piezoelectric device according to the present embodiment is characterized in that slurry with powder of a piezoelectric material dispersed therein is spin-coated to thereby form a piezoelectric layer.

The method for fabricating the piezoelectric device according to the present embodiment will be explained below.

First, a lower electrode 14 is formed on an insulating substrate 12 of alumina by screen-printing method using, e.g., Ag—Pd paste (FIG. 1A).

Then, a slurry with piezoelectric material powder dispersed therein is spin coated onto the insulating substrate 12 with the lower electrode 14 formed on it. For example, 100 g of 0.5 $Pb(Ni_{1/3}Nb_{2/3})O_3$–$0.35PbTiO_3$–$0.15PbZrO_3$ (hereinafter called PNN-PT-PZ in the present embodiment), 5 g of a binder, 2 g of an plasticizer, 0.2 g of a deflocculant and 55 g of a solvent are mixed to thereby prepare the slurry, which is applicable by spin coating.

Subsequently, the substrate is subjected to a 2 hour-heat treatment of, e.g., 1000° C. to sinter the piezoelectric layer 16 applied by the spin coating (FIG. 1B).

Then, an upper electrode 18 is formed on the thus-formed piezoelectric layer 16 by screen-printing method using, e.g., Au paste (FIG. 1C).

Thus, the piezoelectric device 10 including the lower electrode 14, the piezoelectric layer 16 and the upper electrode 18 laid on the insulating substrate 12 in the stated order can be prepared.

Thus, the present embodiment uses a slurry with a piezoelectric material dispersed therein to form the piezoelectric layer by spin coating, whereby a large amount of the piezoelectric layer having a uniform thickness can be formed in a short period of time.

As a result, the method according to the present embodiment can fabricate the piezoelectric device at fabrication costs which are much reduced in comparison with those of the conventional piezoelectric devices.

By forming an ink jet printer head by the use of the above-described piezoelectric device, the ink jet printer head can be fabricated by a simpler fabrication process.

In the present embodiment, the piezoelectric layer is formed by applying a slurry with an insulating material of PNN-PT-PZ dispersed in by spin coating, but other slurries with other piezoelectric materials dispersed in can be used. For example, PZT-based piezoelectric materials, or those including other third components may be used.

In the present embodiment, alumina is used as the insulating substrate, but other materials may be used as long as the materials can stand the piezoelectric layer sintering temperature and the electrode baking. MgO substrates and Si substrates, for example, can be used.

The upper electrode and the lower electrode may be formed of other materials. For example, it is possible to form the upper electrode and the lower electrode of Pt paste by screen-printing method.

[Second Embodiment]

A method for fabricating a piezoelectric device according to a second embodiment of the present invention will be explained with reference to FIG. 2.

Figure 2:
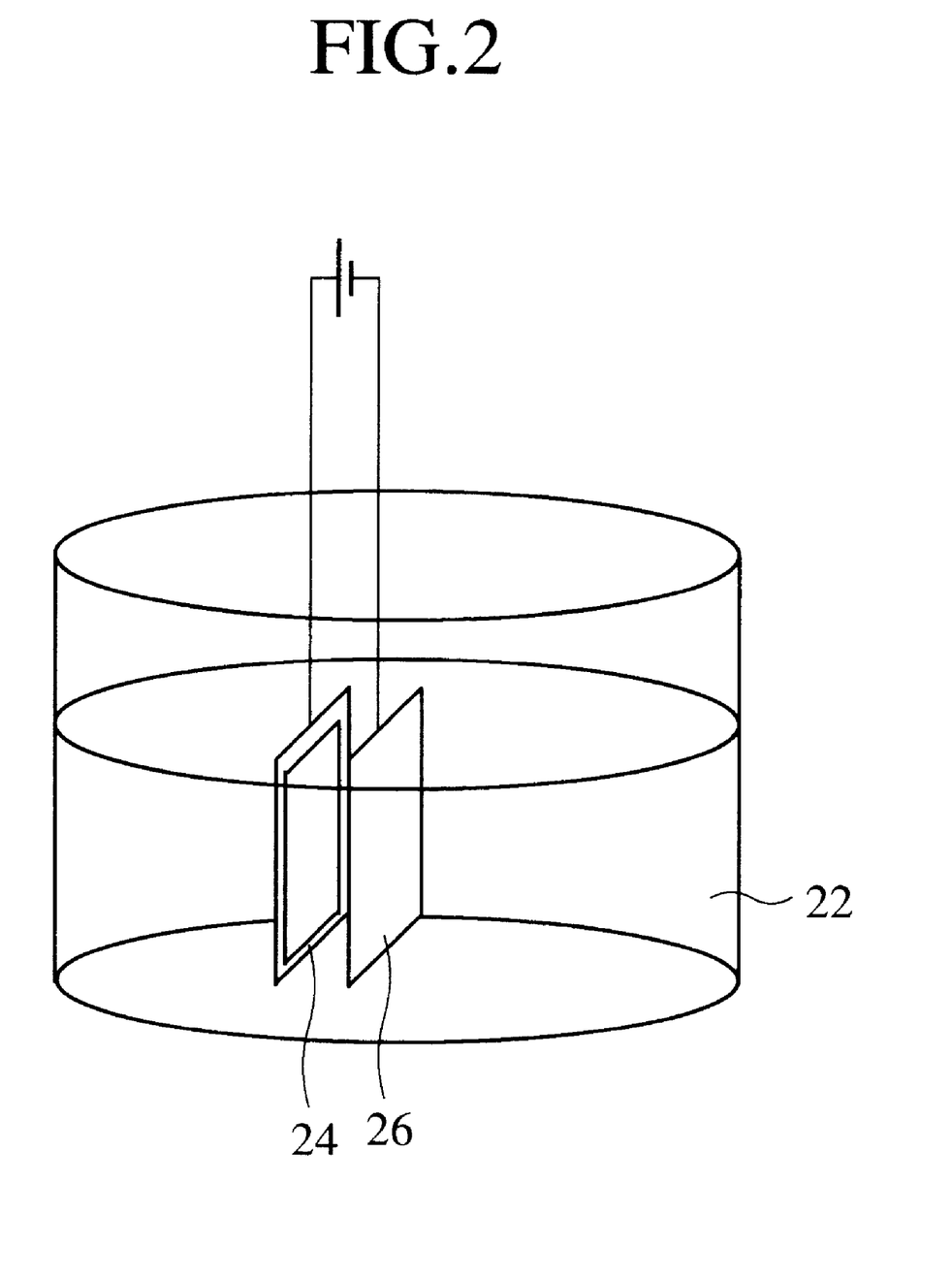
FIG. 2 is a view explaining electrophoretic deposition used in the method for fabricating the piezoelectric device according to a second embodiment of the present invention.

FIG. 2 is a view explaining electrophoretic deposition used in the method for fabricating the piezoelectric device according to the present embodiment.

The method for fabricating the piezoelectric device according to the present embodiment is characterized in that a piezoelectric layer is formed by electrophoretic deposition.

First, the electrophoretic deposition will be explained.

In the electrophoretic deposition two sheets of electrodes are immersed in a suspension with deposition particles dispersed in, and a d.c. voltage is applied between the electrodes, whereby the deposition particles are deposited on one of the electrodes which is the anode. By the use of a solution with a piezoelectric material dispersed in as the suspension, the piezoelectric material can be deposited.

As exemplified in FIG. 2, a suspension 22 of acetone or water with a piezoelectric material dispersed in is used, and a substrate 24 for the piezoelectric material to be deposited on, and a metal plate 26 are immersed in the suspension, opposed to each other. A d.c. voltage is applied with the substrate 24 as the anode, and the piezoelectric material can be deposited on the substrate 24.

The deposition by the electrophoretic deposition is superior in intra-surface uniformity of film thickness, and can easily control film thickness. The electrophoretic deposition can easily thin the piezoelectric film.

Then, the method for fabricating the piezoelectric device according to the present embodiment will be detailed with the method for fabricating the piezoelectric device according to the first embodiment shown in FIG. 1.

First, a lower electrode 14 is formed on an insulating substrate 12 of alumina by thin film technique or screen-printing (see FIG. 1A).

A piezoelectric layer 16 is formed by electrophoretic deposition on the insulating substrate 12 with the lower electrode 14 formed on.

As a suspension, a solution with calcinated piezoelectric powder dispersed of a composition of, e.g., 0.5 $Pb(Ni_{1/3}Nb_{2/3})O_3$–$0.35PbTiO_3$–$0.15PbZrO_3$ is used. As deposition conditions, for example, a gap between the substrate 24 and the metal plate 26 is 10 mm, an applied voltage is 1 kV, and a deposition time is 60 seconds (see FIG. 2).

The piezoelectric layer 16 is thus deposited, whereby a film thickness of the piezoelectric layer 16 can be easily controlled. By suitably setting the above-described deposition conditions, the piezoelectric film 16 can be formed with good controllability even the film is as relatively thin as 1–40 μm.

Subsequently, the substrate is subjected to a 2 hour-heat treatment of, e.g., 1000° C. to sinter the deposited piezoelectric layer 16 (see FIG. 1B).

Then, an upper electrode 18 is formed on the thus-formed piezoelectric layer 16 by screen-printing method.

Thus, the piezoelectric device 10 including the lower electrode 14, the piezoelectric layer 16 and the upper electrode 18 laid on the insulating substrate 12 in the stated order can be prepared.

As described above, according to the present embodiment, the piezoelectric layer is deposited by the electrophoretic deposition, so that a thickness of the piezoelectric layer can be easily made thin. As a result, the piezoelectric device can operate at low voltages.

An amount of the piezoelectric layer can be smaller, so that the piezoelectric device can be compact and light. An amount of lead can be smaller, which is ecologically preferable.

The use of the piezoelectric device according to the present embodiment in an ink jet printer had can make the ink jet printer itself smaller and light.

In the present embodiment, as a piezoelectric material to be deposited, piezoelectric calcinated powder of a composition of 0.5 $Pb(Ni_{1/3}Nb_{2/3})O_3$–$0.35PbTiO_3$–$0.15PbZrO_3$ is used, but piezoelectric materials of other compositions may be used. As a piezoelectric material, materials having large piezoelectric constants $d_{33}$ are preferable, and better characteristics can be obtained as a piezoelectric constant $d_{33}$ is larger.

[Third Embodiment]

A method for fabricating a piezoelectric device according to a third embodiment of the present invention will be explained with reference to FIGS. 3 and 4.

Figure 3:
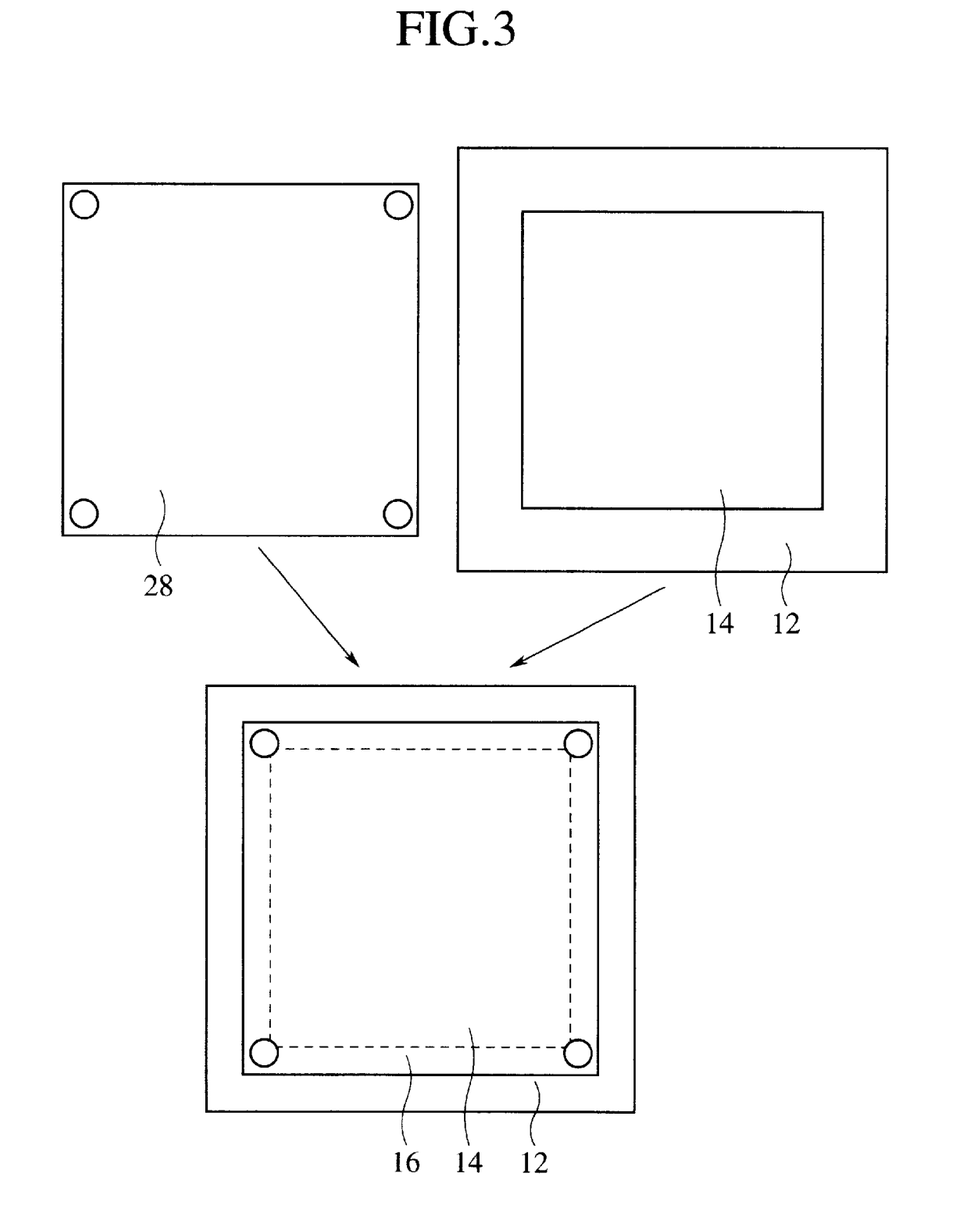
FIG. 3 is views of the piezoelectric device according to a third embodiment of the present invention at the steps of the method for fabricating the same, which explain the method (Part 1).
Figure 4A:
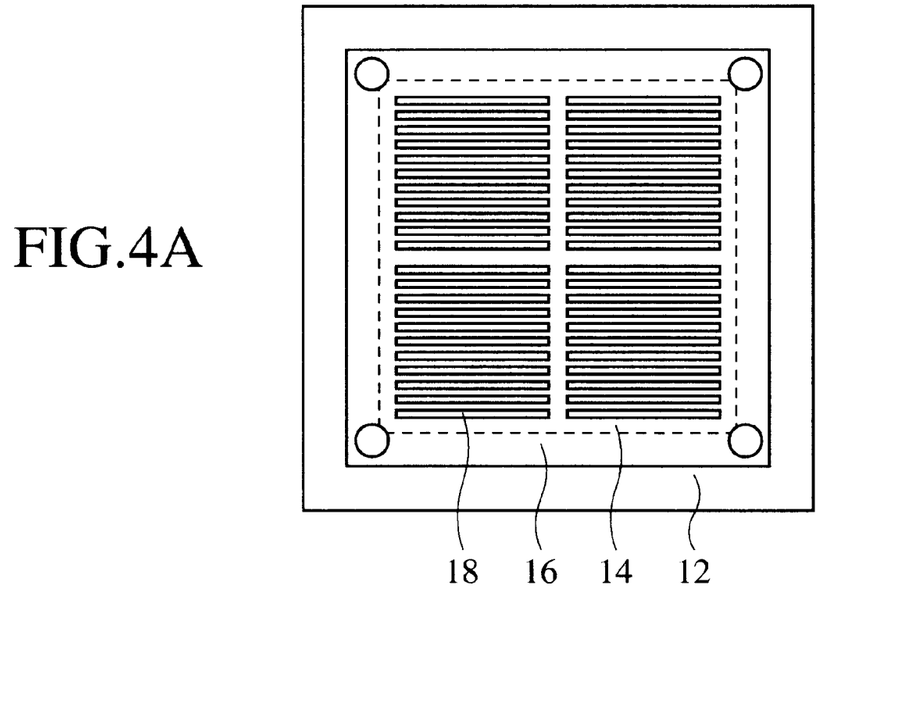
FIGS. 4A and 4B are views of the piezoelectric device according to the third embodiment of the present invention at the steps of the method for fabricating the same, which explain the method (Part 2).
Figure 4B:
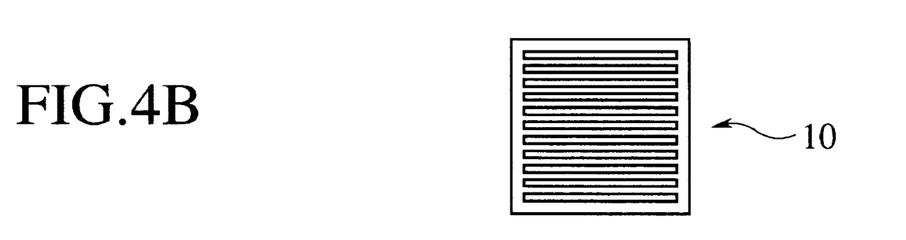

FIGS. 3 and 4A–4B are views of the piezoelectric device according to the present embodiment at the steps of the method for fabricating the same, which explain the method.

The method for fabricating the piezoelectric device according to the present embodiment is characterized in that a piezoelectric green sheet containing a piezoelectric material is formed, and the green sheet is laid on a substrate and integrated therewith.

Next, the method for fabricating the piezoelectric device according to the present invention will be detailed.

First, the piezoelectric green sheet which is to be a piezoelectric layer is prepared by the following method.

A slurry which is to be a raw material of the piezoelectric green sheet is prepared by mixing piezoelectric powder of a composition of $0.5\ Pb(Ni_{1/3}Nb_{2/3})O_3-0.35PbTiO_3-0.15PbZrO_3$ having particle size of about 1.0 $\mu$m, PVB as an organic binder, DBP as a plasticizer, and ethanol as an organic solvent.

Then, the piezoelectric green sheet is formed, by doctor blade method, of the thus-prepared slurry. Then, the thus-formed piezoelectric green sheet is punched into, e.g., 100 mm square and is subjected to pressure treatment at a 100 MPa pressure by uniaxial press.

Thus the piezoelectric green sheet 28 is prepared (FIG. 3).

Then, the piezoelectric device is formed by the use of the thus-prepared piezoelectric green sheet 28.

First, a lower electrode 14 is formed on an insulating substrate 12 of alumina by screen-printing method using, e.g., Ag—Pd paste (FIG. 3).

Then, the pressure-treated piezoelectric green sheet 28 is laid on the insulating substrate 12 with the lower electrode 14 formed on and vacuum packaged with a film and is subjected to hydrostatic pressure press under the conditions of 80° C. and 40 MPa.

The hydrostatic pressure press is a method in which samples are pressed, immersed in water or oil. The hydrostatic pressure press can apply a pressure uniformly on all the surface of a sample even when the surface is rough, and pressure disuniformity does not take place in the sample. The hydrostatic pressure press is superior to the uniaxial press in this point.

Subsequently the covering film for the hydrostatic pressure press is released, and a heat treatment is conducted in the atmosphere for 3 hours at 1000° C. to sinter the piezoelectric green sheet. Thus a piezoelectric layer 16 is formed (FIG. 3).

Then, an upper electrode 18 is formed on the thus-formed piezoelectric layer 16 by screen-printing method using, e.g., Au paste (FIG. 4A).

Then, the margin is eliminated, and the piezoelectric device 10 is formed (FIG. 4B).

As described above, according to the present embodiment, the piezoelectric layer 16 is formed by laying the piezoelectric green sheet 28 on the insulating substrate 12 and integrating the same, whereby an amount of the piezoelectric material to be used in the piezoelectric layer 16 can be reduced. This decreases an amount of the lead compound having a large specific gravity. The piezoelectric device 10 can be smaller and lighter.

The use of the piezoelectric device according to the present embodiment in an ink jet printer head makes the ink jet printer head smaller and lighter, and decreases an amount of lead in the ink jet printer.

[Fourth Embodiment]

The piezoelectric device according to a fourth embodiment, and the method for fabricating the same will be explained with reference to FIGS. 5 and 6A–6C.

Figure 5:
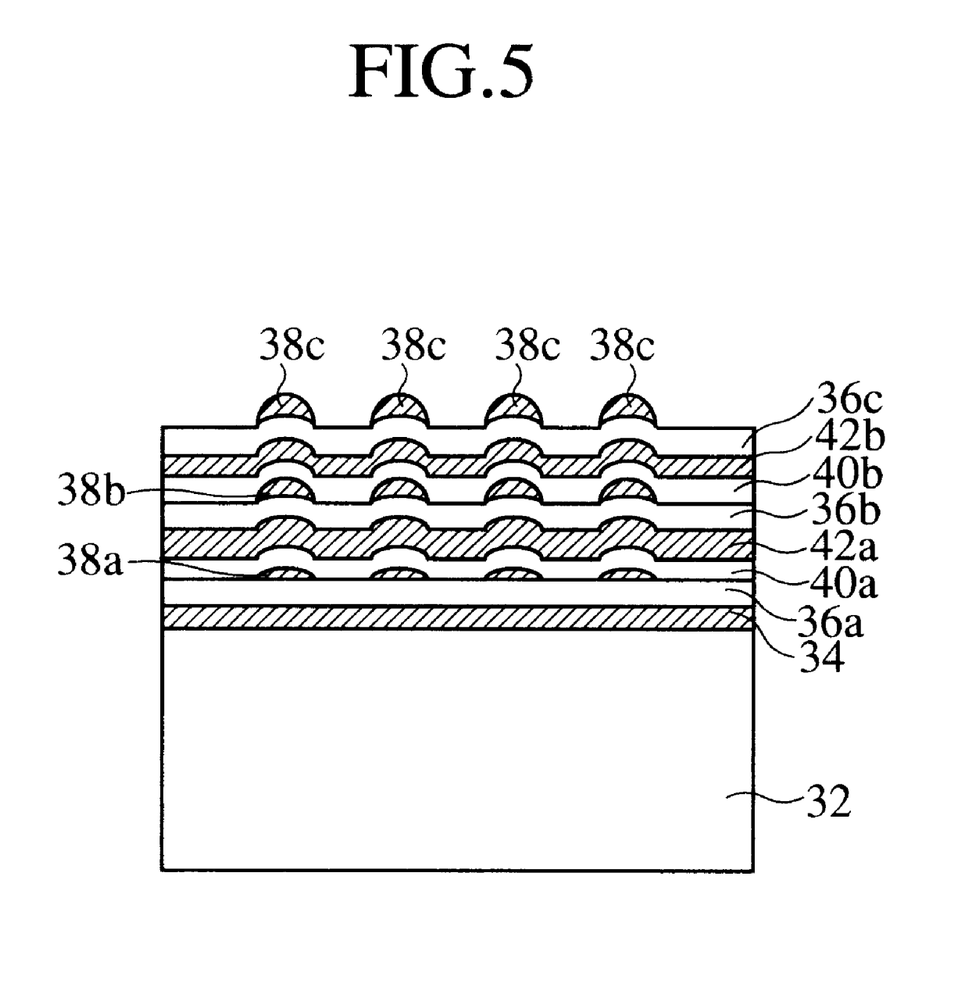
FIG. 5 is a diagrammatic sectional view of the piezoelectric device according to a fourth embodiment of the present invention, which explains the structure thereof.
Figure 6A:
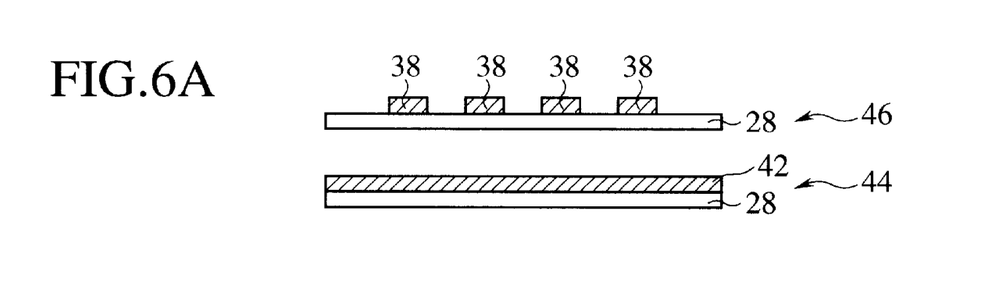
FIGS. 6A–6C are sectional views of the piezoelectric device according to the fourth embodiment of the present invention at the steps of the method for fabricating the same, which explain the method.
Figure 6B:
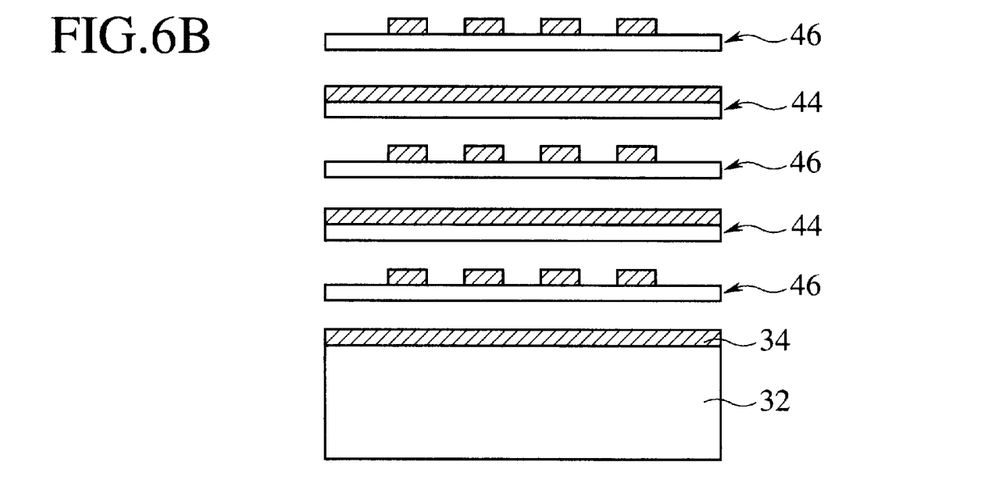
Figure 6C:
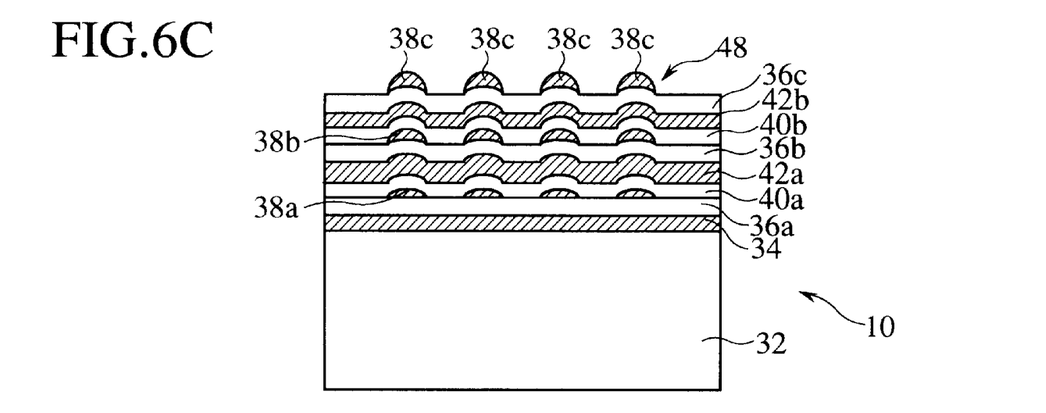

FIG. 5 is a diagrammatic sectional view of the piezoelectric device according to the present embodiment, which shows its structure, and FIGS. 6A–6C are diagrammatic sectional views of the piezoelectric device at the steps of the method for fabricating the same, which explain the method.

First, the structure of the piezoelectric device according to the present embodiment will be explained.

On an insulating substrate 32 with a common electrode 34 formed on there are formed a piezoelectric layer 36 with individual electrodes 38 formed on and a piezoelectric layer 40 with a common electrode 42 formed on in plural layers.

That is, on the insulating substrate 32 of alumina are formed the common electrode 34, the piezoelectric layer 36a, the individual electrode 38a, the piezoelectric layer 40a, the common electrode 42a, the piezoelectric layer 36b, the individual electrode 38b, the piezoelectric layer 40b, the common electrode 42b, the piezoelectric layer 36c and the individual electrode 38c one on the other in the stated order.

A plurality of the displacement layers each thus comprising the piezoelectric layer sandwiched between the electrodes are laid one on another to form the piezoelectric device, whereby large amounts of displacement can be obtained in comparison with piezoelectric device comprising one displacement layer. Furthermore, the regions where the individual electrodes are formed more projected as more displacement layers are laid, so that larger amounts of displacement can be obtained.

As a result, in comparison with the conventional piezoelectric device, larger amounts of displacement can be obtained at low electric power. The use of the piezoelectric device according to the present embodiment makes it possible to fabricate a ink jet printer head which can print at low electric power and with high precision.

In the present embodiment, the common electrodes 42 and the individual electrodes 38 correspond to the lower electrode 14 and the upper electrode 18 of the first to the third embodiments.

Then, the method for fabricating the piezoelectric device according to the present embodiment will be explained.

First, piezoelectric green sheets 28 are prepared in the same way as in the method for fabricating the piezoelectric device according to the third embodiment.

Next, the electrodes 38 and 42 are formed on the thus-prepared piezoelectric green sheets by screen-printing method using, e.g., conducting paste. The electrodes having a pattern of the common electrodes, and the electrodes having a pattern of the individual electrodes are formed on respective ones of the piezoelectric green sheets. A plurality of the piezoelectric green sheets 44 with the common electrodes 42 formed on and a plurality of the piezoelectric green sheet 46 with the individual electrodes 38 formed on are prepared (FIG. 6A).

Then, the above-described piezoelectric green sheets 44 and 46 with the electrodes formed on it are used to form the piezoelectric device.

First, the common electrode 34 is formed on the insulating substrate 32 of alumina by a screen-printing method.

Then, the piezoelectric green sheets 46 with the individual electrodes 38 formed on, them and the piezoelectric green sheets 44 with the common electrodes 42 formed on them are alternately laid one on another (FIG. 6B) and are subjected to hydrostatic pressure press to be press-bonded.

Subsequently, the thus-prepared multi-layer body is heat treated in the atmosphere, e.g, for 3 hours at 1000° C. to sinter the multi-layer body (FIG. 6C).

Then, the sintered multi-layer body is cut and machined into a required configuration, and the piezoelectric device is formed.

In the method for fabricating the piezoelectric device according to the present embodiment, the pressurization using the hydrostatic pressure press is especially significant. That is, the pressurization by the hydrostatic pressure press allows projections 48 formed of the individual electrodes 38 to remain as they are.

The projections 48 are thus left as they are, whereby larger amounts of displacement of the piezoelectric layers can be obtained. The projections 48 can be larger as a larger number of the individual electrodes 38 are laid. A plurality of the displacement layer comprising the piezoelectric layer sandwiched between the electrodes are laid one on another, whereby larger amounts of displacement can be obtained.

As described above, according to the present embodiment, the piezoelectric layers are formed by the use of the piezoelectric green sheets, whereby the piezoelectric device can be small and light, and can reduce lead amounts.

The hydrostatic pressure press is used for pressurizing the laid piezoelectric green sheets, whereby occurrence of cracks, etc. due to disuniform pressure of the pressurization can be prevented, and a thickness of the electrodes formed on the piezoelectric green sheets can remain with a result that the displacement layers can have larger amounts of displacement.

A plurality of the displacement layers are laid one on another, whereby the displacement layers can have larger amounts of displacement.

In the present embodiment, the piezoelectric green sheets are laid one on another so that three displacement layers can be formed, but a construction and a number of the piezoelectric green sheets to be laid one on another are not limited to the present embodiment. Preferably a construction and a number of the piezoelectric green sheets to be laid one on another are suitably adjusted so that a required displacement amount can be obtained.

[Fifth Embodiment]

The ink jet printer head and a method for fabricating the same according to a fifth embodiment of the present invention will be explained with reference to FIGS. 7, 8A–8C and 9.

Figure 7:
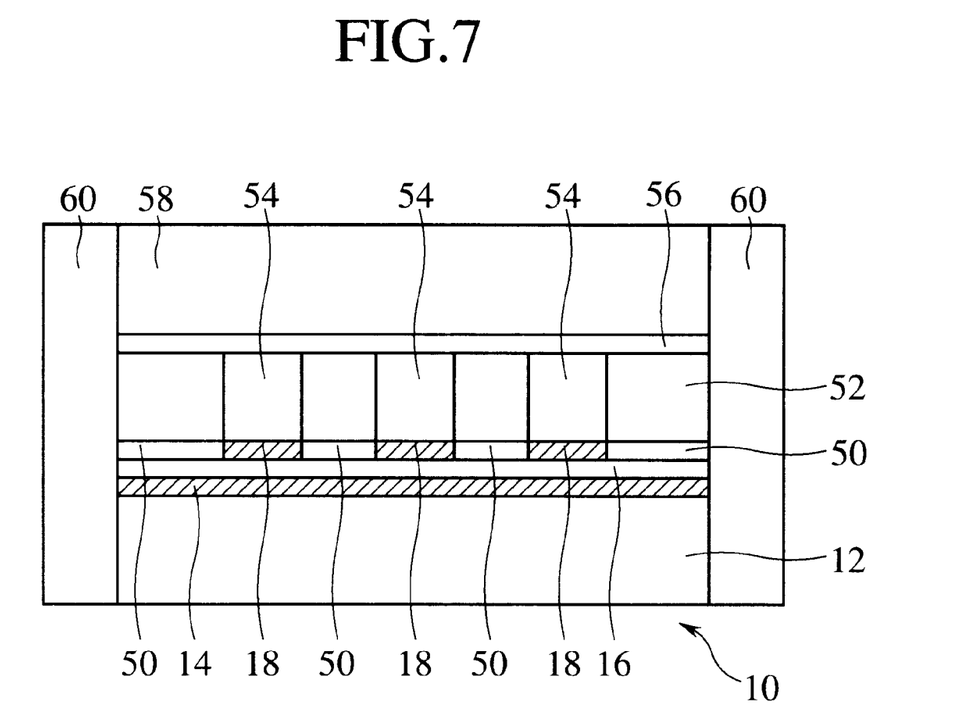
FIG. 7 is a diagrammatic sectional view of the ink jet printer head according to a fifth embodiment of the present invention, which explain the structure thereof.
Figure 8A:
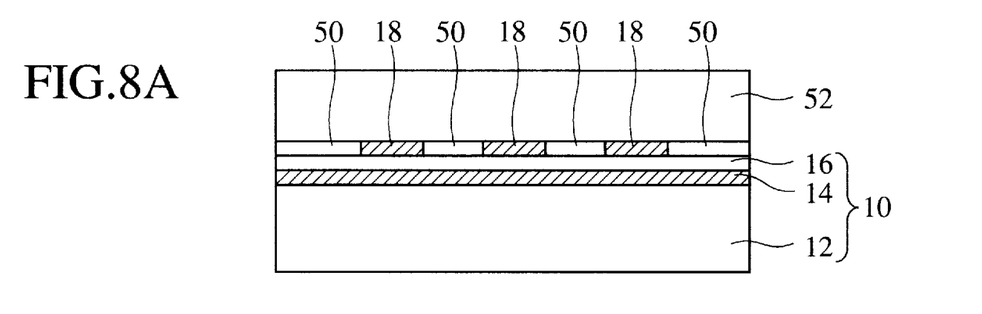
FIGS. 8A–8C are sectional views of the ink jet printer head according to the fifth embodiment at the steps of the method for fabricating the same, which explain the method.
Figure 8B:
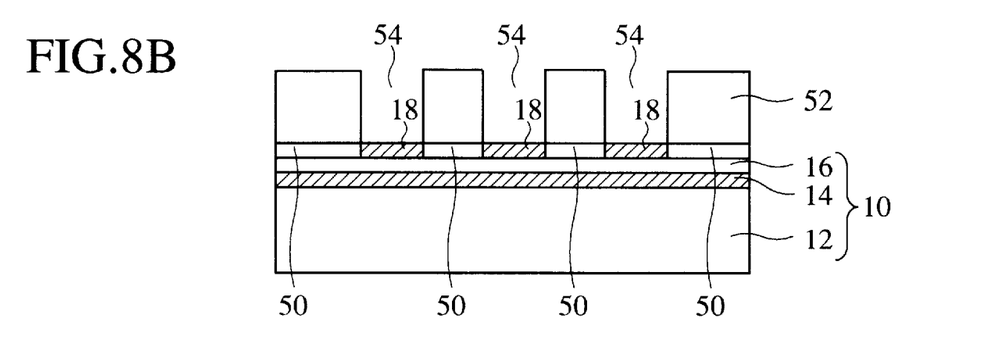
Figure 8C:
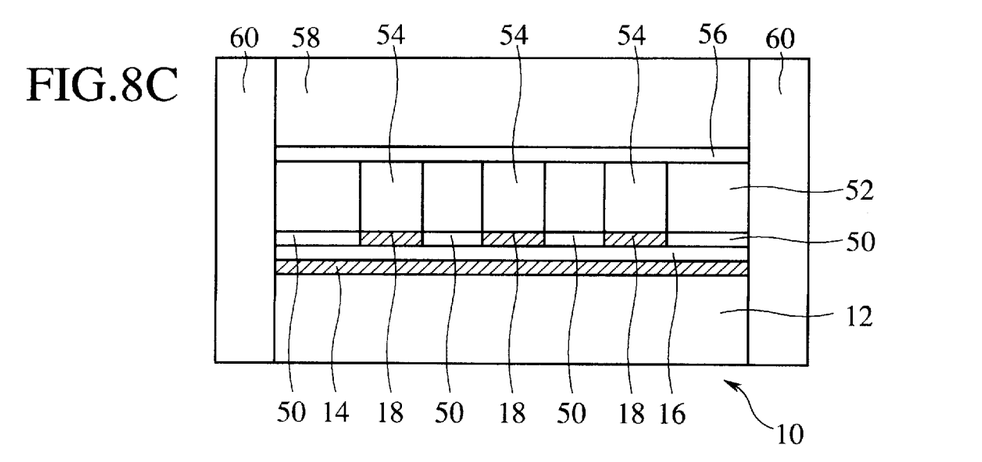
Figure 9:
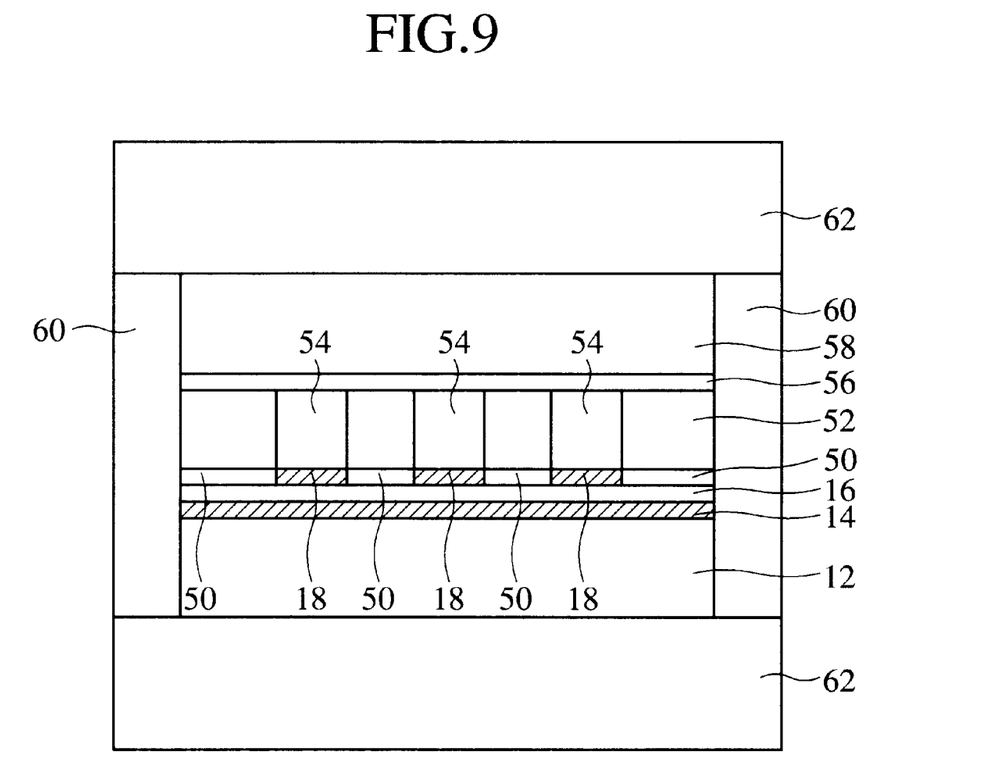
FIG. 9 is a diagrammatic sectional view of the ink jet printer head according to a modification of the fifth embodiment, which explains the structure thereof.

FIG. 7 is a diagrammatic sectional view of the ink jet printer head according to the present embodiment, which shows the structure thereof. FIGS. 8A–8C are sectional views of the ink jet printer heads at the steps of the method for fabricating the same, which explain the method. FIG. 9 is a diagrammatic sectional view of a modification of the ink jet printer according to the present embodiment.

First, the ink jet printer head according to the present embodiment will be explained.

A dry film 50 is formed on a piezoelectric device 10 comprising a lower electrode 14, a piezoelectric layer 16 and upper electrodes 18 laid on an alumina substrate 12 one on another in the stated order, for adhering the lower layer to an upper layer. The dry film 50 is formed on the piezoelectric device 10 in regions where the upper electrodes 18 are not formed. A silicon wafer 52 with openings 54 formed on the upper electrodes 18 is formed on the piezoelectric device 10 with the dry film 50 formed on, adhered by the dry film 50. The openings 54 formed in the silicon wafer 52 are pressure chambers. An alumina plate 58 is adhered to the top of the silicon wafer 52 by a dry film 56.

High rigidity plates 60 of alumina are adhered to the side walls of the ink jet printer head of such structure, for efficient compression of the pressure chambers.

Then, the method for fabricating the ink jet printer head according to the present embodiment will be explained.

First, the silicon wafer 52 is adhered to, by the dry film 50, the piezoelectric device 10 comprising the lower electrode 14, the piezoelectric layer 16, the upper electrodes 18 laid on the insulating substrate 12 one on another in the stated order. (FIG. 8A). The dry film 50 has portions which correspond to the upper electrodes 18 opened in advance to cover only regions of the dry film 50 where the upper electrodes 18 are not formed.

Then, the silicon wafer is etched at the front surface to open the openings 54 which reach the top of the upper electrodes 18. The thus-formed openings 54 are the pressure chambers for compressing ink (FIG. 8B).

Subsequently, the alumina plate 58 is adhered by the dry film 56 to the top of the silicon wafer 52 with the openings 54 formed in.

Then, the high rigidity plates 60 of, e.g., alumina are adhered to the side walls of the thus-formed multi-layer body (FIG. 8C). The adhesive is exemplified by dry film of thermoplastic resins.

The ink jet printer head is thus fabricated.

As described above, according to the present embodiment, the high rigidity plates 60 of, e.g., ceramics is adhered to the side walls of the piezoelectric device for the prevention of general deformation of the device due to displacement of the ink jet printer head, whereby the pressure chambers can be efficiently compressed.

The use of the first to the fourth embodiments of the piezoelectric device in ink jet printer heads makes the ink jet printer heads small and light, reduces lead amounts, and makes the ink jet printers operative at low voltages.

In the present embodiment, the ink jet printer head has only the side walls covered with the high rigidity plates 60 for higher compression of the pressure chambers, but may have the upper and the bottom sides as well covered with the high rigidity plates for further improved compression of the pressure chambers.

For example, as shown in FIG. 9, the top and the bottom surfaces of the ink jet printer head are covered with high rigidity plates 62, and the plates 62 are fixedly welded to the high rigidity plates 60 on the side walls, whereby further improved ink injection characteristics can be obtained.

What is claimed is:

1. A piezoelectric device comprising:

an insulating substrate; and a plurality of displacement layers stacked on the insulating substrate, each of the displacement layers including a common first electrode, a piezoelectric layer and a plurality of second electrodes laid one on the other in the stated order, wherein a part of a surface of the piezoelectric device in a region where the first and the second electrodes overlap each other is projected out of the rest of the surface of the piezoelectric device more than a thickness of the second electrode.

2. A piezoelectric device according to claim 1, wherein each said displacement layer includes an additional piezoelectric layer laid upon the plurality of second electrodes.

3. An ink jet printer head comprising:

a piezoelectric device comprising an insulating substrate and a plurality of displacement layers stacked on the insulating substrate, each of the displacement layers including a common first electrode, a piezoelectric layer and a plurality of second electrodes laid one on the other in the stated order, wherein a part of a surface of the piezoelectric device in a region where the first and the second electrodes overlap each other is projected out of the rest of the surface of the piezoelectric device more than a thickness of the second electrode;

a wafer formed on the plurality of displacement layers of the piezoelectric device and having, on the second electrodes, a plurality of openings which act as pressure chambers;

an insulation plate formed on the wafer; and a high rigidity plate provided on a vertical side wall of the piezoelectric device, the wafer and the insulation plate for securing the piezoelectric device.

4. An ink jet printer head according to claim 3, further comprising:

a high rigidity plate provided on a vertical side wall of the piezoelectric device, the wafer and the insulation plate for securing the piezoelectric device.

* * * * *